US005742522A

United States Patent [19]

Yazici et al.

[11] Patent Number: 5,742,522
[45] Date of Patent: *Apr. 21, 1998

[54] ADAPTIVE, ON LINE, STATISTICAL METHOD AND APPARATUS FOR DETECTION OF BROKEN BARS IN MOTORS BY PASSIVE MOTOR CURRENT MONITORING AND DIGITAL TORQUE ESTIMATION

[75] Inventors: Birsen Yazici, Clifton Park; Gerald Burt Kliman, Niskayuna, both of N.Y.

[73] Assignee: General Electric Company, Schenectady, N.Y.

[*] Notice: The term of this patent shall not extend beyond the expiration date of Pat. No. 5,726,905.

[21] Appl. No.: 627,721

[22] Filed: Apr. 1, 1996

[51] Int. Cl.$^6$ .......................... G01R 23/00; G05B 13/00
[52] U.S. Cl. .................. 364/551.01; 364/481; 364/483; 364/485; 364/492; 324/772; 324/545; 324/76.11; 324/76.19; 361/23; 361/31; 361/30
[58] Field of Search ........................ 364/481, 483, 364/485, 550, 551.01, 554, 492; 324/772, 510, 511, 545, 76.11, 76.19; 382/219, 225, 228; 395/13, 20, 184.01; 361/3, 23, 30, 31

[56] References Cited

U.S. PATENT DOCUMENTS

| 4,761,703 | 8/1988 | Kliman et al. | 361/23 |
|---|---|---|---|
| 4,912,770 | 3/1990 | Seto et al. | 382/107 |
| 5,049,815 | 9/1991 | Kliman | 324/772 |
| 5,075,896 | 12/1991 | Wilcox et al. | 382/225 |
| 5,161,204 | 11/1992 | Hutcheson et al. | 382/157 |
| 5,270,640 | 12/1993 | Kohler et al. | 324/772 |
| 5,345,158 | 9/1994 | Kliman et al. | 318/434 |
| 5,392,364 | 2/1995 | Yokoyama et al. | 382/190 |
| 5,477,163 | 12/1995 | Kliman | 324/772 |
| 5,514,978 | 5/1996 | Koegl et al. | 324/772 |
| 5,570,256 | 10/1996 | Schoen et al. | 361/31 |
| 5,574,387 | 11/1996 | Petsche et al. | 324/772 |
| 5,576,632 | 11/1996 | Petsche et al. | 324/772 |
| 5,578,937 | 11/1996 | Haynes et al. | 324/772 |
| 5,602,761 | 2/1997 | Spoerre et al. | 364/554 |
| 5,629,870 | 5/1997 | Farag et al. | 364/551.01 |

OTHER PUBLICATIONS

"Pattern Recognition and Neural Engineering" by K.Fukunaga, et al, *Neural Networks Concepts, Applications and Implementations*, vol. 1, pp. 10–33.

"Properties of Quadratic Covariance Bounds" by L. McWhorter, et al, *IEEE Transactions on Information Theory*, Sep. 1993, vol. 39, Issue 5, pp. 1176–1178.

(List continued on next page.)

*Primary Examiner*—James P. Trammell
*Assistant Examiner*—Tuan Q. Dam
*Attorney, Agent, or Firm*—Ann M. Agosti; Marvin Snyder

[57] ABSTRACT

During a learning stage a motor current signal is monitored, and estimated motor torque is used to transform the current signal into a time-frequency spectra including a plurality of segments representative of good operating modes. A representative parameter and a respective boundary of each segment is estimated. The current signal is monitored during a test stage to obtain test data, and the test data is compared with the representative parameter and the respective boundary of each respective segment to detect the presence of a fault in a motor. Frequencies at which broken bar faults are likely to occur in a motor can be estimated using the estimated motor torque, and a weighting function can highlight such frequencies during estimation of the parameter. The current signal can be further subdivided into the segments by monitoring sidebands of the frequency components of current spectrum strips of each segment. Estimating the parameter and the boundary of each segment can include calculating a segment mean (the representative parameter) and variance for each frequency component in each respective segment; calculating a modified Mahalanobis distance for each strip of each respective segment; and for each respective segment, using respective modified Mahalanobis distances to calculate a respective radius about a respective segment mean to define the respective boundary.

16 Claims, 6 Drawing Sheets

OTHER PUBLICATIONS

"Motor Bearing Damage Detection Using Stator Current Monitoring" by RR Schoen, et al, 1994 IEEE, pp. 110–116.

"Using a Neural/Fuzzy System to Extract Heuristic Knowledge of Incipient Faults in Induction Motors: Part II"–Application, by PV Goode, et al, 1995 IEEE, pp. 139–146.

"Classification of Wideband Transient Signals Using Spectral–Based Techniques" by R Hippenstiel, et al, pp. 1479–1483.

"Image Staining and Differential Diagnosis of Ultrasound Scans Based on the Mahalanobis Distance" by R Momenan, et al, IEEE Trans on Medical Imaging vol. 13, No. 1, Mar. 1994, pp. 37–47.

"Sensor Data Fusion Using Mahalanobis Distance and Single Linkage Algorithm" by G. Raju, et al, 1994 IEEE, pp. 2605–2610.

"The Indusrial Application of Phase Current Analysis to Detect Rotor Winding Faults in Squirrel Cage Induction Motors" by Dr. Rankin, Power Engineering Journal, Apr. 1995, pp. 77–84.

"Induction Motor Faults Diagnostic Via Artificial Neural Network (Ann)" by R Distefano, et al, pp. 220–225.

"On the Bias of Mahalanobis Distance Due to Limited Sample Size Effect" by T Takeshita, et al, 1993 IEEE, pp. 171–174.

"An Unsupervised, On–Line System for Induction Motor Fault Detection Using Stator Current Monitoring" by Schoen, et al, IEEE 1994, vol. 3 pp. 103–109.

"Noninvasive Detection of Broken Rotor Bars in Operating Induction Motors" by Kliman, et al, IEEE Transactions on Energy Conversion, vol. 3, No. 4, Dec. 1988, pp. 873–879.

"Pattern Recognition Principles" by Tou, et al, p. 87.

"Introduction to Statistical Pattern Recognition" by Fukunaga, p. 98.

fig. 1 fig. 2 fig. 3 fig. 4 fig. 5 fig. 6 fig. 7

ADAPTIVE, ON LINE, STATISTICAL METHOD AND APPARATUS FOR DETECTION OF BROKEN BARS IN MOTORS BY PASSIVE MOTOR CURRENT MONITORING AND DIGITAL TORQUE ESTIMATION

BACKGROUND OF THE INVENTION

Motor current spectrum monitoring can be used to assess changes in motor physical conditions. Because these changes in the current spectrum depend on the load characteristics of the motor and the physical structure of the motor, it is not possible to use a fixed baseline current value (or a corresponding power spectrum) to indicate the presence of motor fault.

Some motor faults are more likely to occur in certain frequency ranges in the current spectrum. Typically, the frequencies of interest depend on the physical motor structure and the motor operating conditions such as torque and speed. Frequently, structural and operational information is not available for computing the exact frequencies of interest and the frequencies therefore must be estimated.

A technique for detecting motor faults is discussed in R. R. Schoen et al., "An Unsupervised, On-Line System for Induction Motor Fault Detection Using Stator Current Monitoring," IEEE Conference Record of the 1994 Industry Applications Conference Twenty-Ninth IAS Annual Meeting (2–6 Oct. 1994), pp. 103–09, vol. 1. Schoen et al. describe a system using artificial neural networks, rule-based frequency filters, and a neural network clustering algorithm to learn the spectral characteristics of a good motor and its load operating on-line. Schoen et al. calculate an adaptable frequency table which indicates the number of occurrences and the average magnitude for each accepted frequency component of the spectra and an adaptable threshold value which is a multiple of the average of all the frequency components by a redefined scaling multiplier. Schoen et al. apply spectrum techniques which are based on stationarity assumptions. Such techniques assume that the spectrum is stable over a relatively long period of time.

Another technique for detecting motor faults is described in commonly assigned Yazici et al., U.S. application Ser. No. 08/534,530, filed Sep. 27, 1995, wherein for a given motor it is assumed that the motor exhibits a sequence of good operating modes corresponding to statistically homogeneous patterns and motor conditions. A "good" operating mode includes those modes wherein minor imperfections, such as small misalignments, may be occurring but are insufficient to regard as a motor fault. Within each good operating mode (but not across the modes), the motor current data is assumed to be stationary so that a fixed set of representative parameters can be estimated. The set of representative parameters can then be used to determine whether a given current spectrum belongs to one of the good operating modes. Frequencies at which faults are likely to occur in a motor can be estimated, and a weighting function can highlight such frequencies during development of the representative parameters. If a test spectrum falls outside all the modes, it is tagged as a potential fault.

SUMMARY OF THE INVENTION

It would be desirable to have a passive, on line broken bar detection technique that can account for the time-varying nature of the current data and can adjust for specific time-varying motor load and physical conditions without requiring special instrumentation or refined estimations to compute the frequencies at which broken bars are likely to occur. In the present invention, a digital torque estimator is used to detect load changes and thereby identify the good operating modes. The digital torque estimator can also be used to adjust test patterns to be monitored via speed estimation.

The present invention does not require as high a resolution of the frequency spectrum as the technique of aforementioned Schoen et al., IEEE Conference Record. The statistical measure adapted at the testing stage reflects the spread or the resolution of each frequency component and thus can reduce the required memory. By using torque data to estimate speed or slip and to restrict the frequency range, extraneous components are excluded and thus less false broken bar alarms occur when load oscillations and other interference phenomena are present. By use of time-varying spectra in the analysis, applications wherein load oscillations are common, such as coal crushers with rapidly varying speeds, can be efficiently processed.

BRIEF DESCRIPTION OF THE DRAWINGS

The novel features of the invention are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
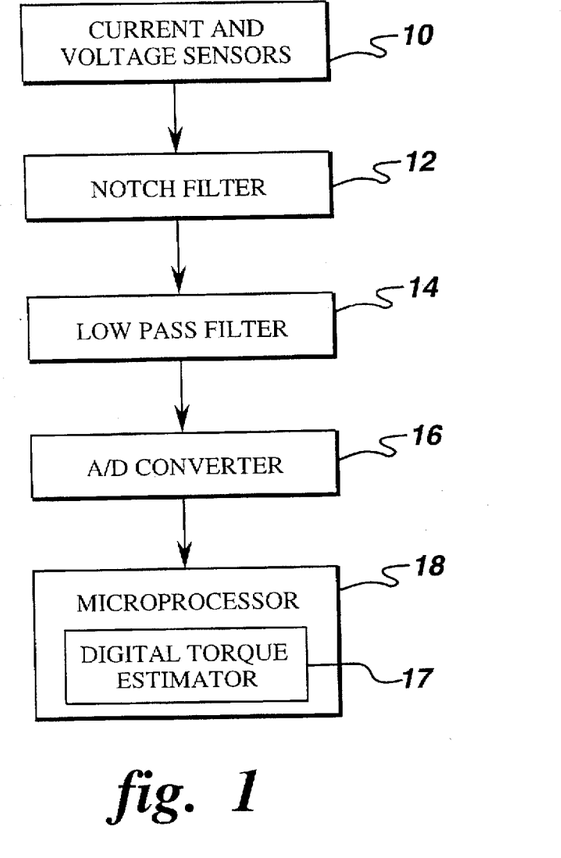
FIG. 1 is a block diagram including fault detection elements used in a preprocessing stage of the present invention.

FIG. 1 is a block diagram including fault detection elements used in a preprocessing stage of the present invention. Conventional current and voltage sensors 10 can be used to detect motor current and voltage data from a motor such as, for example, an induction motor. In an induction motor, the motor current data of interest will be stator current. Preferably, the motor current and voltage data for AC machines is passed through a notch filter 12 to improve the dynamic range of an analog-to-digital (A/D) converter 16. In one embodiment the notch filter comprises a 60 Hz±½ Hz notch filter. After passing through the notch filter, the data is passed through a low pass filter 14 to prevent aliasing. In one embodiment, the low pass filter passes data having frequencies at or below about 0.8 kHz. The filtered data is then digitized by A/D converter 16 before being transmitted to a microprocessor 18 having a digital torque estimator 17. In one embodiment, A/D converter 16 is a 1.92 kHz sampler.

Figure 2:
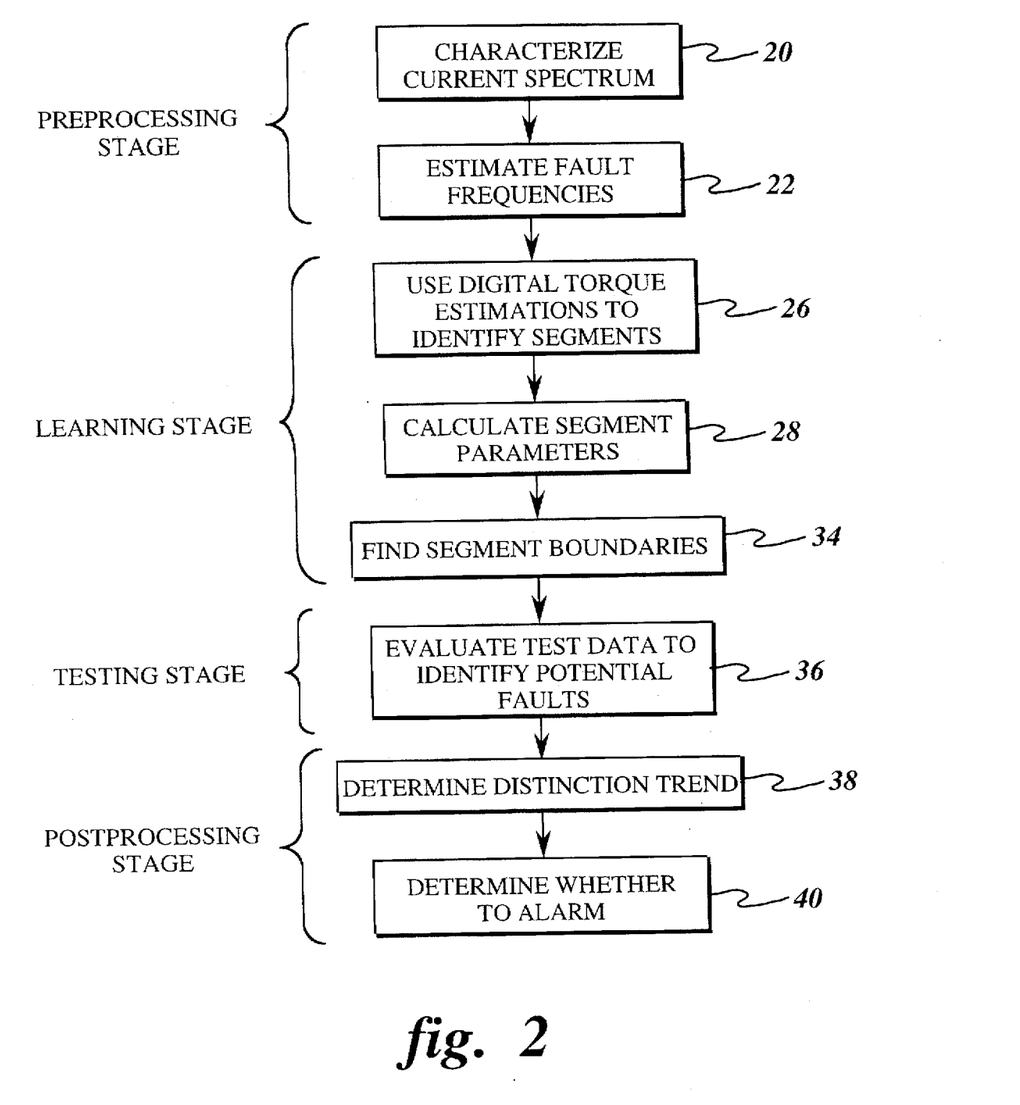
FIG. 2 is a flow chart illustrating a sequence of steps which can be performed to detect motor faults.

FIG. 2 is a flow chart illustrating a sequence of steps of the present invention which can be performed to detect motor faults. In the adaptive method of the present invention, the output current is monitored over a period of time during which the motor is exposed to various good operating modes (as many as possible), and motor torque is estimated to detect load changes. The current signal is transformed into time-frequency spectra including a plurality of substantially constant torque segments representing the good operating modes. A set of statistical representative parameters is calculated for each segment and used as a baseline for comparison during a testing stage.

Data acquisition and signal conditioning occur in a preprocessing stage represented by steps 20 and 22. The preprocessing stage is performed for a plurality of load conditions of a particular motor. The more load conditions which are tested, the more complete the analysis (and the more time-consuming and expensive the procedure).

Figure 3:
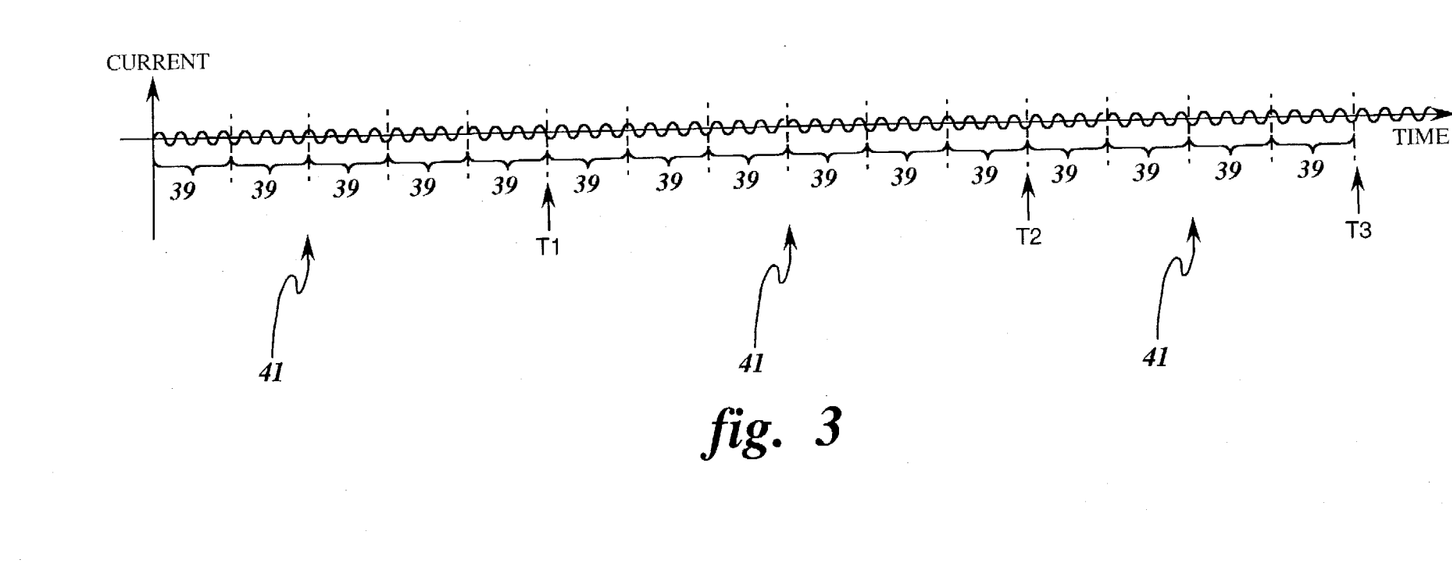
FIG. 3 is an example graph of current data divided into a plurality of portions which are grouped in several windows.

In step 20, motor current data occurring over time is divided into a plurality of portions 39, as shown in FIG. 3. Preferably the portions are non-overlapping contiguous portions each occupying an equal length of time. Although the portions are shown as including about three 360 degree periods each, preferably a portion will include a range of approximately 180–200 periods. In one embodiment the portions are spaced in four second intervals.

Figure 4:
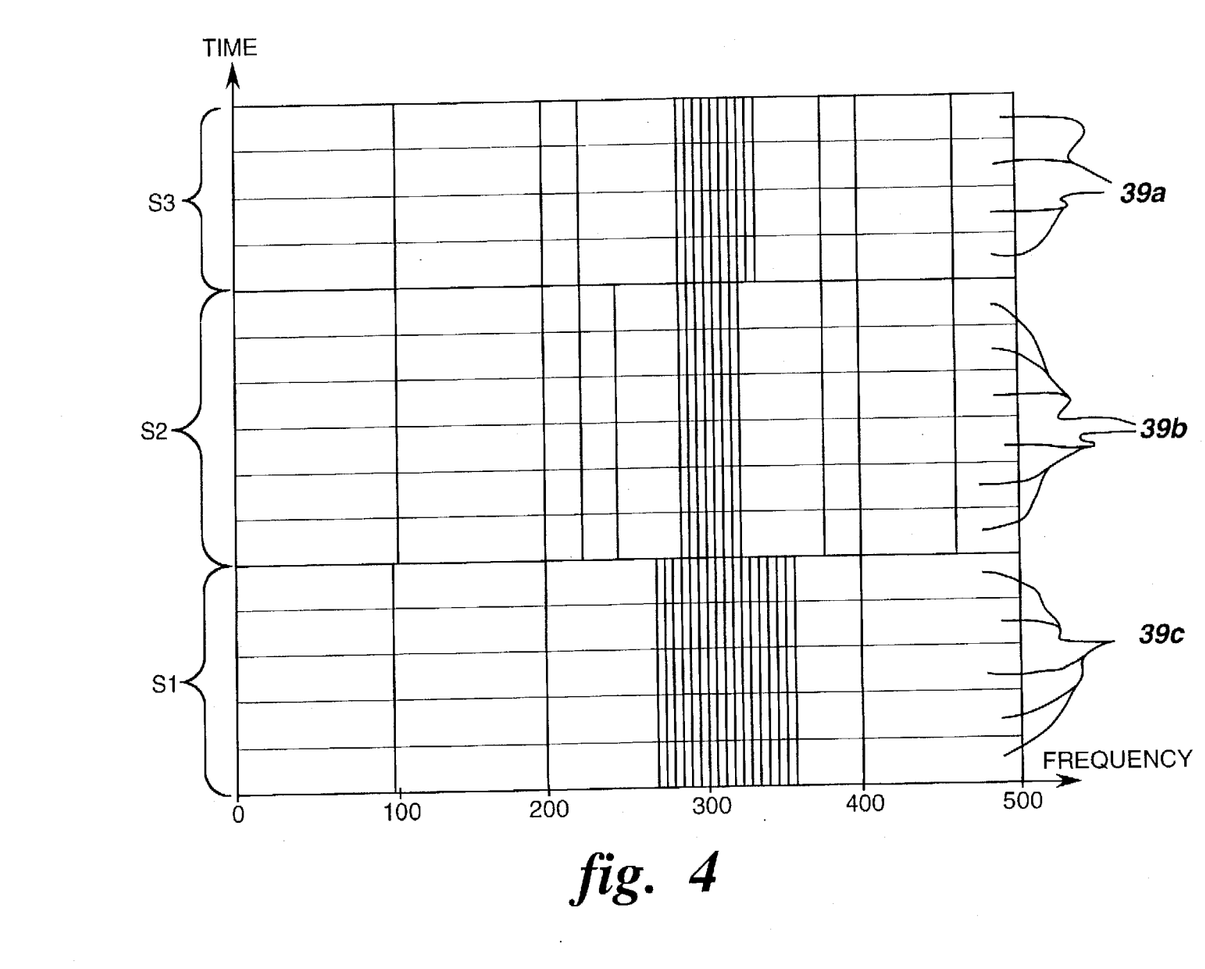
FIG. 4 is an example graph of frequency versus time illustrating a stacking of current segments.

After the current data is divided into a plurality of portions, the current spectrum is obtained within each portion by multiplying the time domain signal within each portion by an appropriate window, such as a Hanning window, and performing a fast Fourier transform, for example. Preferably the current data is monitored over a sufficient time period for an appropriate number of load conditions to occur. The resulting spectra are arranged one after the other in a time array, thereby forming a time-frequency spectrum. FIG. 4 is an example graph of frequency versus time illustrating a stacking of current spectrum strips 39a corresponding to time portions 39.

At step 22, the frequencies at which particular faults are likely to occur are estimated. These frequencies $f_{brk}$ can be calculated for rotor asymmetries such as broken bars as follows:

$$f_{brk} = f_s \left[ g \left( \frac{1-s}{n_p/2} \right) \pm s \right],$$

wherein $f_s$ is the electrical supply frequency, s is per unit (pu) slip, g is an integer 1, 2, 3, 4, etc., and $n_p$ is the number of poles. The number of poles is available from the nameplate of the motor. Under normal winding conditions, only those frequencies for which $2g/n_p$=1, 5, 7, 11, 13, etc., will be seen with significant amplitude in the stator current. In practice the pu slip has a small magnitude. Therefore, for a 2 pole machine, for example, the frequencies of interest will be the sidebands of first order and higher order harmonics.

The slip s changes with the speed of the motor and can be calculated using the following equations:

$$s = 1 - \frac{f_m}{f_{sy}} \text{ and } f_{sy} = \frac{2f_s}{n_p},$$

wherein $f_m$ is the mechanical speed, and $f_{sy}$ is the synchronous speed.

In many cases, the mechanical speed is not readily available. However, as described in G. B. Kliman et al., U.S. Pat. No. 5,477,163, issued Dec. 19, 1995, the torque of an induction motor is almost a linear function of the per unit (pu) slip (and thus speed) over the range between light loads and modest overloads. Therefore, once the torque is known, the pu slip can be closely estimated by using the nameplate data which lists the rated torque, the rated speed, and the synchronous speed. Torque can be calculated by digital torque estimator 17 using current and voltage values as described in Kliman et al., U.S. Pat. No. 5,345,158, which is herein incorporated by reference, and in Paul C. Krause, *Analysis of Electric Machinery*, section 4.6, McGraw-Hill Book Company (1986).

Figure 5:
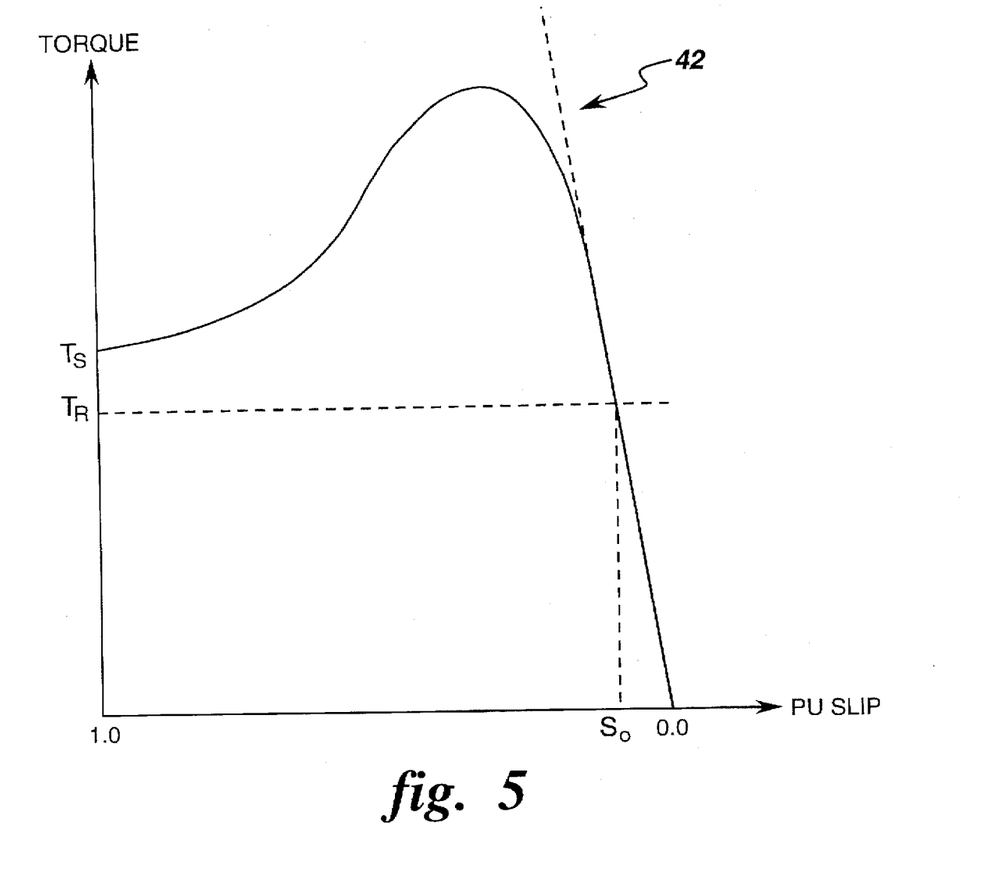
FIG. 5 is a graph illustrating the relation between motor torque and speed.

FIG. 5 is a graph illustrating the relation between torque and pu slip for a typical motor with arrow 42 indicating an approximately straight line along $T=T_R(s/s_o)$, with T representing torque, $T_R$ representing rated torque, s representing pu slip, $s_o$ representing rated slip, and $T_s$ representing starting toque. The approximation begins to deviate from the linear shape when the torque exceeds about 1.5 $T_R$ in the motor's normal operating range.

The frequencies at which broken bars are likely to occur are useful for providing a weighting function when determining a statistical boundary for use in testing the motor, as discussed below.

During a learning stage represented by steps 26, 28, and 34, substantially constant torque segments representative of good operating modes are identified, representative good operating mode parameters are extracted for each segment, and a boundary is defined for each segment.

At step 26, torque estimations from digital torque estimator 17 are used to define segments S1, S2, and S3 of FIG. 4. It has been empirically observed that stator current exhibits statistically different spectrums under different loads. Furthermore, misalignment in the shaft and other mechanical irregularities will induce statistical changes in the current spectrum.

Current and power are often used for estimating the load of a motor, but these variables are frequently in error at low and high loads. However, torque (which is the load) can be calculated by digital torque estimator 17, as discussed above. Because torque is the load, estimated torque changes can be used to mark the time at which load changes occur (shown in FIG. 3 as T1, T2, and T3). The current data can thus be divided into highly homogenous load windows 41 and misalignment modes by using the output signal of the digital torque estimator. Although the windows are shown as including a small number of portions 39 each, a window will probably include a range of on the order of two or three hundred portions for a sixty hertz line frequency with the portions 39 of FIG. 3 spaced at 4 second intervals. The time changes T1, T2, and T3 shown in FIG. 3 can then be used to identify the edges of segments S1, S2, and S3 of FIG. 4.

Increased precision in segment formation can be obtained, if desired, by monitoring the sidebands of the harmonics of each current spectrum strip. Rotating asymmetries in the rotor system will result in a significant peak in the spectrum of a sideband of the first order harmonic, but not in spectrums of sidebands of higher order harmonics. In contrast, broken bars will result in significant peaks in the spectrums of sidebands of both first and higher order harmonics. Thus, the presence of a significant peak in the spectrum of a first order harmonic sideband but not in a higher order sideband indicates an asymmetry (as opposed to a fault). When any such asymmetry is identified in a current segment strip, the respective segment can be subdivided.

At step 28 the segment representative parameters are calculated. In one embodiment, the parameters comprise a spectrum mean and variance. Sample mean $M^i_k$ and variance $(\sigma^i_k)^2$ for a given frequency component (entry) k of a segment i of data (representative of a good operating mode) can be estimated using the following formulas:

$$M_k^i = \frac{1}{N_i} \sum_{j=1}^{N_i} X_k^i(j),$$

$$(\sigma_k^i)^2 = \frac{1}{N_i} \sum_{j=1}^{N_i} (X_k^i(j) - M_k^i)^2, \text{ and}$$

$$k = \frac{1}{p}(nf_{brk} \pm ls - w), \ldots, \frac{1}{p}(nf_{brk} \pm ls), \ldots,$$

$$\frac{1}{p}(nf_{brk} \pm ls + w), l = \begin{cases} 2 & n=1 \\ 4 & n=5 \\ 6 & n=7 \\ \ldots & n=\ldots \end{cases}$$

wherein $N_i$ is the number of current spectrum strips in segment i, $X^i_{k(j)}$ is the kth entry of the jth strip of segment i, $M^i_k$ and $(\sigma^i_k)^2$ are the kth entry of the mean vector $M^i$ and the covariance matrix $V^i$, respectively, for segment i, p is Hz per bin, w determines the size of the monitored window chosen around the frequency $f_{brk}$ at which broken bars are likely to occur, s is the per unit slip, and n represents the order of the harmonic. When n=1, the slip frequency components are on both sides of the supply frequency due to the speed oscillations, but for higher harmonics they are substantially only on the lower side of the supply frequency.

The value of w can be selected experimentally and is preferably large enough so that the actual frequency at which broken bars occur (which should be relatively close to the estimated $f_{brk}$) will be in the monitored window, while small enough so that other frequency components do not interfere with the data analysis. A rage of about 0.25 hertz to about 2 hertz has been found to be useful for w, for example.

At step 34, a statistical segment boundary is defined for each good operating mode. As discussed below, the goal when testing a sample is to determine whether a given test spectrum falls within a boundary of the segments representing good operating modes. To define a boundary, a statistical distance is defined between each member of the segment and the segment parameter. Next, by reviewing the statistics of the distances between the segment members and the segment parameter, a radius for the boundary can be determined for each segment. In one embodiment, as disclosed in aforementioned Yazici et al., U.S. application Ser. No. 08/534,530, the distance measure for each segment is the modified Mahalanobis distance $D_{ij}$:

$$D_{ij} = \sum_{k=1}^{\frac{2w}{p}+1} \frac{(\omega(k))(X_j^i(k) - M^i(k))^2}{\sigma^{i2}(k)},$$

wherein $\omega(k)$ represents a weighting function of the kth entry, $X^i_j(k)$ is the kth entry of the spectrum that belongs to strip j of segment i, $M^i(k)$ represents the mean value for the kth entry of segment i, and $\sigma^{i2}(k)$ represents the variance value for the kth entry of segment i.

Figure 6:
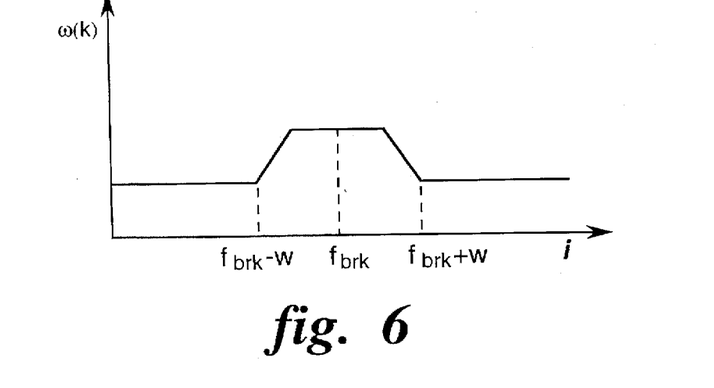
FIG. 6 is a graph illustrating an example weighting function.

The weighting function $\omega(k)$ is an optional parameter which highlights the frequencies which have been determined to be likely frequencies for faults. Values varying between 1 and 0 can be assigned for each frequency component of the spectrum. Respective weights can be chosen based on physics and/or empirical observations. For example, the simplest method for choosing the weights would be to use a box profile wherein predetermined relevant frequencies have a weight of 1 and all other frequencies have a weight of zero. More precise methods of assigning weights would be to form a triangular fit for each frequency which has been determined to be a likely frequency for a fault or to design an appropriately sloped bell curve about each relevant frequency point. Another useful option for a weighting function is shown in FIG. 6 wherein a partially flat and partially angled function is used.

A radius $D_i$ (comprising, in one embodiment, a mean of the modified Mahalanobis distances) and a variance $\rho_i$ of a given segment can be calculated, as disclosed in aforementioned Yazici et al., U.S. application Ser. No. 08/534,530, using the expressions:

$$D_i = \frac{1}{N_i} \sum_{j=1}^{N_i} D_{ij}, \text{ and}$$

$$\rho_i = \frac{1}{N_i} \sum_{j=1}^{N_i} (D_{ij} - D_i)^2.$$

In a testing stage represented by step 36 test data is acquired and compared with the parameters of the good operating modes using a statistical measure. A decision based on statistical analysis is made as to whether the test sample is close to one of the good operating parameters or not. If not, the test sample is tagged as a potentially faulty signal.

In the testing stage, the motor current is again monitored and separated into portions which are each converted to test data by performing a Fourier transform, for example. A statistical distance between the test data and the parameters of the good operating modes can be determined in the same manner as discussed with respect to the learning stage. The modified Mahalanobis distance $\tau i$ between a given segment and the test data can be obtained, in a similar manner as discussed above with respect to the segments representative of good operating modes, from the following equation:

$$\tau_i = \sum_{k=1}^{\frac{2w}{p}+1} \frac{(\omega(k))(X^i(k) - M^i(k))^2}{\sigma^{i2}(k)},$$

wherein $X^i(k)$ is the kth frequency component of the test data.

After the relevant spectral distance (modified Mahalanobis distance in this example) has been estimated, as disclosed in aforementioned Yazici et al., U.S. application Ser. No. 08/534,530, it can be determined whether the test data belongs to one of the segments using the equation:

$$\Delta_i = \left| \frac{D_i - \tau_i}{\rho_i} \right|,$$

wherein $\Delta_i$ is a comparison parameter for a segment i which is compared to a corresponding parameter $\alpha_i$. The comparison occurs for each segment i, and it is determined whether for any segment i the corresponding $\Delta_i$ is less than the corresponding $\alpha_i$. In one embodiment, $\alpha_i$ is the higher of (a) 2.5 or (b) the maximum modified Mahalanobis distance of the respective segment i. If there are one or more segments i for which $\Delta_i$ is less than $\alpha_i$, then the test data is not representative of a potential fault and can, if desired, be merged into the segment having the smallest $\Delta_i$ value.

If there is no segment i for which $\Delta_i$ is less than $\alpha_i$, then the test data may represent a potential fault. In an optional embodiment, instead of automatically declaring such test data a potential fault, an analysis of the sidebands of the test data harmonics is performed. If, a significant peak occurs in the spectrum of sideband of the first order harmonic but not in the spectrums of sidebands of higher order harmonics, then the test data is more likely representative of an asymmetry or other abnormality instead of a broken bar. If significant peaks occur both in the first and higher order harmonics, then a broken bar is more probable and the test data should therefore be declared a potential fault.

In a postprocessing stage represented by steps 38 and 40 the potentially faulty signals are trended over time, and a decision is made whether to indicate an alarm. It is assumed that, if a fault exists, consecutive test data samples will be potential fault signals which will eventually form a segment which is statistically distinct from all the good operating mode segments.

In one embodiment as disclosed in aforementioned Yazici et al., U.S. application Ser. No. 08/534,530, the distinction between two good operating modes represented by segments a and b is defined by the Bhattacharya distance $B_{ab}$ as follows:

$$B_{ab} = \frac{1}{8}(M^a - M^b)^T \left(\frac{C^a + C^b}{2}\right)^{-1}(M^a - M^b) + \frac{1}{2}\ln\left(\frac{det\left(\frac{C^a + C^b}{2}\right)}{\sqrt{det(C^a C^b)}}\right),$$

wherein $M^a$ and $M^b$ represent the mean vectors and $C^a$ and $C^b$ represent the covariance matrices over each of the frequency component entries of segments a and b, respectively.

In this embodiment, the mean and variance of a potential fault segment are calculated in the same manner as discussed above with respect to good operating mode segments. Then the Bhattacharya distances between the potential fault segment (segment F) and each of the good operating segments are calculated. The shortest of the distances is compared with Bhattacharya distances between the segment (segment A) having the shortest distance to segment F and the other segments representative of good operating modes. If the Bhattacharya distance between segment A and segment F is greater or equal to the maximum Bhattacharya distance between segment A and the rest of the good operating mode segments, then an alarm indication is made. When an alarm indication is made, a motor operator can determine whether to shut down the motor.

EXPERIMENT

The process described with respect to FIG. 2 was tested on current data collected from a thirty-five horse power inside out motor operating in three different load and rotating conditions. In a first mode 1, the load condition was over load, and the rotor alignment was offset by 10 mils. In a second mode 2, the load condition was full load, and the rotor was aligned. In a third mode 3, the load condition was no load, and the rotor was aligned.

During the testing stage, seven sets of data were used, the first three of which were from a non-defective motor and the last four from motors with varying degrees of broken bars, load conditions, and rotating asymmetries, as shown below in the Table wherein each of the tests generated an accurate test result in six separate test sequences.

TABLE

| Test | Load | Alignment | Broken Bars | Test Result |
|------|------|-----------|-------------|-------------|
| 1 | over load | 10 mil offset | none | mode 1 |
| 2 | full load | aligned | none | mode 2 |
| 3 | no load | aligned | none | mode 3 |
| 4 | no load | aligned | 1 cut | outside the modes |
| 5 | full load | aligned | 2 adjacent cuts | outside the modes |
| 6 | no load | aligned | 2 adjacent cuts | outside the modes |
| 7 | full load | aligned | 7/8 cut | outside the modes |

Figure 7:
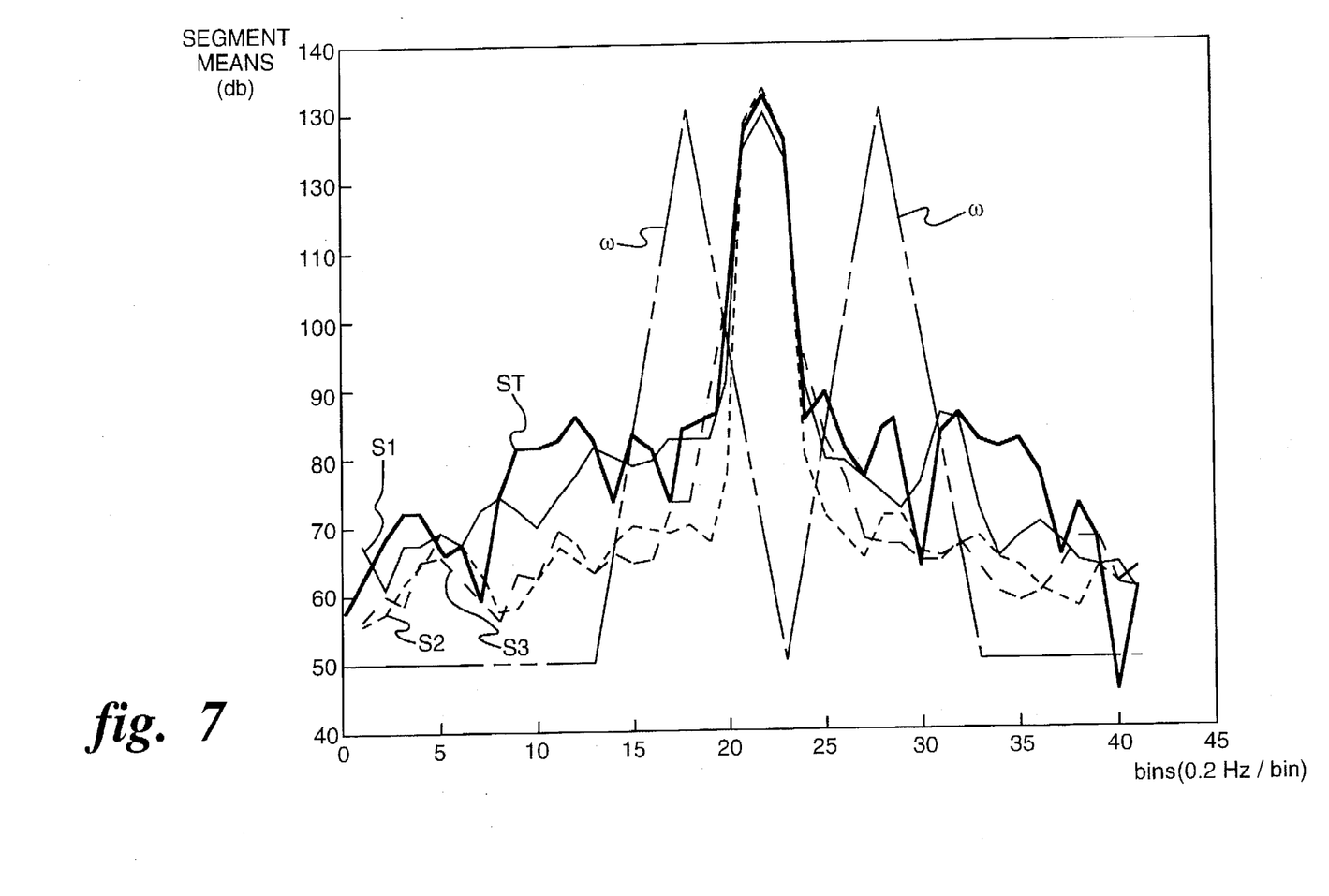
FIG. 7 is a graph illustrating an example of means of three good segments and one test segment surrounding a line frequency.

FIG. 7 is a graph illustrating an example of means of three good segments and one test segment with lines S1, S2, and S3 (representative of the three good segments) and line ST (representative of the test segment) surrounding a line frequency. The weighting function for each sideband is illustrated by line ω which has been enlarged for illustrative purposes. The test data of FIG. 7 was collected under conditions wherein no load was present, the motor was aligned, and there was one cut (break) in the bar.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. An adaptive, on line, statistical method for motor fault detection of broken bars by passive motor current monitoring comprising the steps of:

monitoring a motor current signal during a learning stage;
   estimating motor torque to detect load changes;
   transforming the current signal into time-frequency spectra;
   using the load changes to divide the time-frequency spectra into a plurality of segments representative of good operating modes;
   estimating a representative parameter of each segment;
   determining a respective boundary of each segment;
   monitoring the motor current signal during a test stage to obtain test data, the test stage occurring after the learning stage;
   comparing the test data with the representative parameter and the respective boundary of each respective segment to detect the presence of a fault in a motor.

2. The method of claim 1, further including, prior to estimating the representative parameter of each segment and determining the respective boundary of each segment, the step of estimating frequencies at which broken bar faults are likely to occur in the motor, and
   wherein the steps of estimating the representative parameter of each segment and determining the respective boundary of each segment include introducing a weighting function to highlight the frequencies at which broken bar faults are likely to occur.

3. The method of claim 2, wherein the step of using the load changes to divide the time-frequency spectra includes dividing the current signal into a plurality of portions each having a specified length of time and transforming each of the plurality of portions into a respective current spectrum strip.

4. The method of claim 3, wherein the step of using the load changes to divide the time-frequency spectra further includes monitoring a sideband of a first order harmonic of each respective current spectrum strip.

5. The method of claim 4, wherein the step of using the load changes to divide the time-frequency spectra further includes monitoring additional sidebands of a higher order harmonic of each respective current spectrum strip.

6. The method of claim 3, wherein the steps of estimating the representative parameter of each segment and determining the respective boundary of each segment include:

calculating a segment mean and a segment variance for each of a plurality of frequency components in each respective segment, the representative parameter comprising the mean;

calculating a modified Mahalanobis distance for each respective current spectrum strip of each respective segment using the respective segment means and variances; and for each respective segment, using respective modified Mahalanobis distances to calculate a respective radius about a respective segment mean to define the respective boundary.

7. The method of claim 6, wherein the step of comparing the test data with the representative parameter of each segment and the respective boundary of each segment includes calculating test modified Mahalanobis distances between the test data and each of the segments, and comparing each test modified Mahalanobis distance with a respective radius of a respective segment to determine whether a potential fault exists.

8. The method of claim 7, wherein the step of comparing each test modified Mahalanobis distance with a respective radius of a respective segment to determine whether a potential fault exists includes monitoring sidebands of harmonics of the test data prior to concluding that the potential fault exists.

9. The method of claim 7, wherein the segments comprise good segments and further including:

when a potential fault exists, forming a test segment using consecutive test data and determining a test mean and a test variance of each of a plurality of frequency components in the test segment;

calculating good Bhattacharya distances between each good segment and each of the other good segments;

calculating test Bhattacharya distances between the test segment and each of the good segments;

making a determination whether any test Bhattacharya distance between the test segment and a respective good segment is less than any good Bhattacharya distance between the respective good segment and each of the other good segments; and when the determination is negative, indicating an alarm.

10. An adaptive, on line, statistical method for induction motor broken bar fault detection by passive stator current monitoring comprising the steps of:

monitoring a stator current signal and estimating motor torque during a learning stage;

transforming the stator current signal into a time-frequency spectra including a plurality of segments representative of good operating modes by
dividing the current signal into a plurality of portions each having a specified length of time,
transforming each of the plurality of portions into a respective current spectrum strip,
monitoring changes in the estimated motor torque, and
monitoring sidebands of harmonics of each respective current spectrum strip;

estimating frequencies at which broken bars faults are likely to occur in an induction motor using the estimated motor torque;

estimating a representative parameter and a respective boundary of each segment using a weighting function to highlight the frequencies at which broken bar faults are likely to occur;

monitoring the stator current signal during a test stage to obtain test data, the test stage occurring after the learning stage; and comparing the test data with the representative parameter and the respective boundary of each respective segment and monitoring sidebands of harmonics of the test data to detect the presence of a fault in the induction motor.

11. The method of claim 10, wherein the step of estimating the representative parameter and the respective boundary of each segment includes
calculating a segment mean and a segment variance for each of a plurality of frequency components in each respective segment, the representative parameter comprising the mean,
calculating a modified Mahalanobis distance for each respective current spectrum strip of each respective segment using the respective segment means and variances, and
for each respective segment, using respective modified Mahalanobis distances to calculate a respective radius about a respective segment mean to define the respective boundary; and wherein the step of comparing the test data with the representative parameter and the respective boundary of each segment includes
calculating test modified Mahalanobis distances between the test data and each of the segments, and
comparing each test modified Mahalanobis distance with a respective radius of a respective segment to determine whether a potential fault exists.

12. A passive motor broken bar fault detection apparatus comprising:

a current sensor for monitoring a motor current signal during a learning stage, and for monitoring the motor current signal during a test stage to obtain test data, the test stage occurring after the learning stage;

a computer for, during the learning stage, estimating motor torque, transforming the current signal into a time-frequency spectra including a plurality of segments representative of good operating modes using the estimated motor torque, and estimating a representative parameter and a respective boundary of each segment, and, during the test stage, for comparing the test data with the representative parameter and the respective boundary of each respective segment to detect the presence of a fault in a motor.

13. The apparatus of claim 12, wherein means for the computer transforming the current signal includes means for dividing the current signal into a plurality of portions each having a specified length of time and transforming each of the plurality of portions into a respective current spectrum strip.

14. The apparatus of claim 13, wherein the means for the computer transforming the current signal further includes means for monitoring sidebands of harmonics of each current spectrum strip.

15. The apparatus of claim 13, wherein means for the computer estimating the representative parameter and the respective boundary of each segment includes

- means for calculating a segment mean and a segment variance for each of a plurality of frequency components in each respective segment, the representative parameter comprising the mean;
- means for calculating a modified Mahalanobis distance for each respective current spectrum strip of each respective segment using the respective segment means and variances; and
- means for using, for each respective segment, respective modified Mahalanobis distances to calculate a respective radius about a respective segment mean to define the respective boundary.

16. The apparatus of claim 15, wherein the segments comprise good segments, and wherein means for the computer comparing the test data with the representative parameter and the respective boundary of each segment includes

- means for calculating test modified Mahalanobis distances between the test data and each of the good segments, and comparing each test modified Mahalanobis distance with a respective radius of a respective good segment to determine whether a potential fault exists,
- means for, when a potential fault exists, forming a test segment using consecutive test data and determining a test mean and a test variance of each of a plurality of frequency components in the test segment,
- means for calculating good Bhattacharya distances between each good segment and each of the other good segments and test Bhattacharya distances between the test segment and each of the good segments,
- means for making a determination whether any test Bhattacharya distance between the test segment and a respective good segment is less than any good Bhattacharya distance between the respective good segment and each of the other good segments, and
- means for, when the determination is negative, indicating an alarm.

* * * * *